United States Patent
Li et al.

(10) Patent No.: US 10,524,057 B2
(45) Date of Patent: Dec. 31, 2019

(54) FLEXIBLE PRINTED CIRCUIT BOARD, METHOD FOR MANUFACTURING THE SAME AND LOUDSPEAKER WITH THE SAME

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Biao Li, Shenzhen (CN); Ning Hou, Shenzhen (CN); Hao-Wen Zhong, Shenzhen (CN); Xiao-Wei Kang, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 49 days.

(21) Appl. No.: 15/663,057

(22) Filed: Jul. 28, 2017

(65) Prior Publication Data
US 2019/0007774 A1  Jan. 3, 2019

(30) Foreign Application Priority Data

Jun. 30, 2017  (CN) .......................... 2017 1 0526438

(51) Int. Cl.
*H04R 1/00* (2006.01)
*H04R 9/06* (2006.01)
*H05K 1/03* (2006.01)
*H05K 1/02* (2006.01)
*H04R 31/00* (2006.01)

(52) U.S. Cl.
CPC ............ *H04R 9/06* (2013.01); *H04R 31/006* (2013.01); *H05K 1/028* (2013.01); *H05K 1/0393* (2013.01)

(58) Field of Classification Search
CPC . H04R 9/06; H04R 7/125; H04R 7/18; H04R 9/025; H04R 29/001; H04R 31/003; H04R 9/045
See application file for complete search history.

(56) References Cited

U.S. PATENT DOCUMENTS

| 9,769,571 | B2 * | 9/2017 | Asano | H04R 9/025 |
| 2014/0321691 | A1 * | 10/2014 | Kim | H04R 1/00 381/398 |
| 2017/0245057 | A1 * | 8/2017 | Grazian | H04R 7/125 |

* cited by examiner

*Primary Examiner* — Amir H Etesam
(74) *Attorney, Agent, or Firm* — ScienBiziP, P.C.

(57) ABSTRACT

A flexible printed circuit board used in a loudspeaker as a dome and a holder supporting the dome has a top surface and a bottom surface opposite to the top surface. The flexible printed circuit board comprises a dome portion and a supporting portion surrounding the dome portion. The dome portion is formed by the top surface being depressed from the top surface to the bottom surface and the bottom surface projecting from the top surface to the bottom surface; and a supporting portion surrounds the dome portion.

12 Claims, 3 Drawing Sheets

FLEXIBLE PRINTED CIRCUIT BOARD, METHOD FOR MANUFACTURING THE SAME AND LOUDSPEAKER WITH THE SAME

FIELD

The subject matter herein generally relates to a flexible printed circuit board used as a dome and a holder supporting the dome, a method for manufacturing a flexible printed circuit board, and a loudspeaker with a flexible printed circuit board.

BACKGROUND

Conventionally, a dome and a holder supporting the dome are two independent components of a loudspeaker, the dome and the holder need to be adhered together, so a conventional loudspeaker with the dome and the holder is bulky and thick. Reducing the thickness of the loudspeaker presents challenges.

BRIEF DESCRIPTION OF THE DRAWINGS

Implementations of the present technology will now be described, by way of example only, with reference to the attached figures.

DETAILED DESCRIPTION

Figure 1:
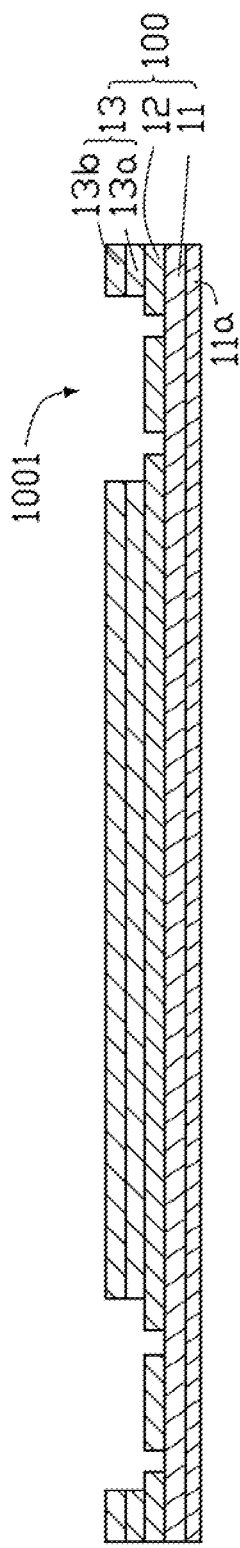
FIGS. 1-5 show a method for manufacturing a flexible printed circuit board in accordance with an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

Figure 5:
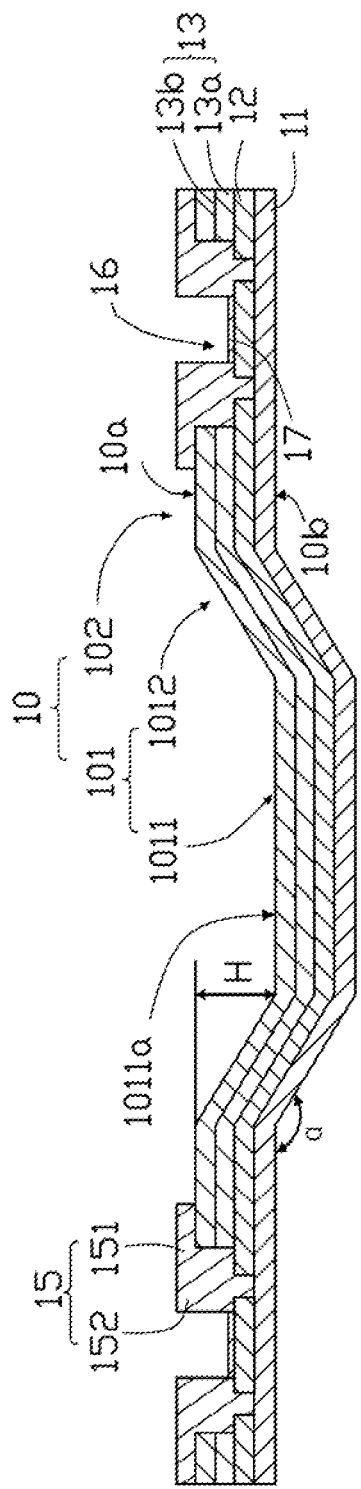

Referring to FIG. 5, a flexible printed circuit board 10 used in a loudspeaker as a dome and a holder supporting the dome is disclosed.

The flexible printed circuit board 10 has a top surface 10a and a bottom surface 10b opposite to the top surface 10a. The flexible printed circuit board 10 has a dome portion 101 and a supporting portion 102. The dome portion 101 is a recess being depressed from the top surface 10a to the bottom surface 10b. The supporting portion 102 surrounds the dome portion 101.

The dome portion 101 has a bottom wall 1011 and a side wall 1012. The bottom wall 1011 is parallel to the supporting portion 102. An angle α is defined between the side wall 1012 and the supporting portion 102. The angle α is from 90° to 180°. A depth H is a distance defined from the top surface 10a of the flexible printed circuit board 10 to a top surface 1011a of the bottom wall 1011 of the dome portion 101. The depth H is from 0 μm to 1000 μm.

The flexible printed circuit board 10 comprises at least one circuit layer 12. The flexible printed circuit board 10 has an upper opening 16. The upper opening 16 is opened at the supporting portion 102 to expose a portion of the circuit layer 12. The circuit layer 12 of the flexible printed circuit board 10 is connected to an external circuit through the upper opening 16.

The flexible printed circuit board 10 can also comprise an insulating layer 11, a first covering layer 13, and a second covering layer 15.

The insulating layer 11 can be made of PI (polyimide), PET (polyethylene terephthalate), PEN (polyethylene naphthalate), PE (polyethylene), teflon, LCP (liquid crystal polymer), or PVC (polyvinyl chloride polymer). A thickness of the insulating layer 11 can be from 12 μm to 50 μm.

The circuit layer 12 can be made of copper. A thickness of the circuit layer 12 can be from 18 μm to 50 μm.

The first covering layer 13 can be formed on the circuit layer 12. The first covering layer 13 can comprise an adhering layer 13a and a protecting layer 13b (shown in FIG. 1). The adhering layer 13a can be made of acrylic or epoxy materials. A thickness of the adhering layer 13a can be from 10 μm to 30 μm. The first covering layer 13 can be made of insulating materials. The first covering layer 13 has a lower opening 1001 (shown in FIG. 1). A portion of the circuit layer 12 is exposed by the lower opening 1001.

Figure 2:
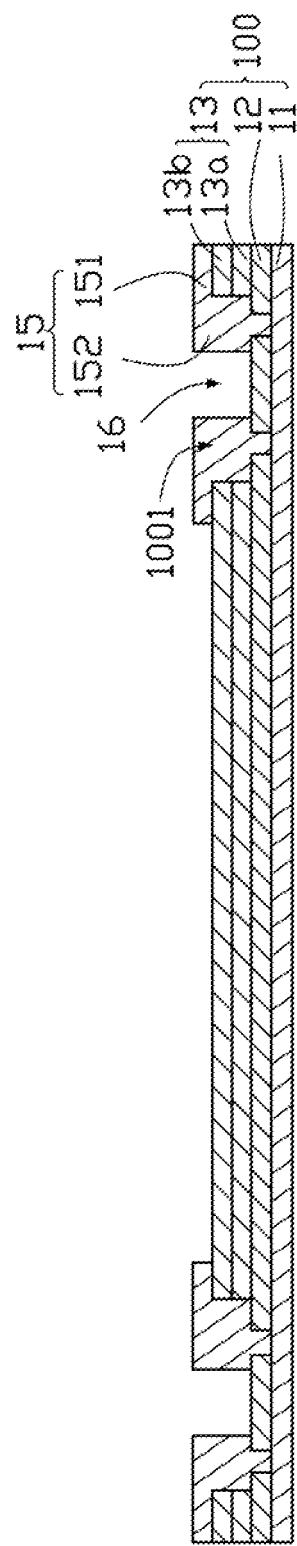

The second covering layer 15 can be formed on the first covering layer 13. The second covering layer 15 can comprise a covering portion 151 and an inserting portion 152. The covering portion 151 is formed on a top surface of the first covering layer 13. The inserting portion 152 is formed on an inner surface of the lower opening 1001 and defines the upper opening 16 as shown in FIG. 2. The second covering layer 15 can be made of insulating materials.

The flexible printed circuit board 10 can also comprise a coating layer 17. The coating layer 17 is formed on the circuit layer 12 exposed from the upper opening 16. The coating layer 17 can be made of Ni/Au alloy (nickel/gold alloy), Ag (silver), Au (gold), or Sn (tin).

Referring to FIGS. 1-5, a method for manufacturing a flexible printed circuit board 10 is provided.

Referring to FIG. 1, a first flexible precursor board 100 is provided. The first flexible precursor board 100 has at least one insulating layer 11 and at least one circuit layer 12.

The insulating layer 11 can be made of PI (polyimide), PET (polyethylene terephthalate), PEN (polyethylene naphthalate), PE (polyethylene), teflon, LCP (liquid crystal polymer), or PVC (polyvinyl chloride polymer). A thickness of the insulating layer 11 can be from 12 μm to 50 μm. An adhering panel 11a can be formed under the insulating layer 11. The adhering panel 11a can be made of acrylic or epoxy materials. The adhering panel 11a can be replaced.

The circuit layer 12 can be made of copper. A thickness of the circuit layer 12 can be from 18 μm to 50 μm.

A first covering layer 13 is provided. The first covering layer 13 has one or more lower openings 1001. The first covering layer 13 is adhered to the circuit layer 12. A portion of the circuit layer 12 is exposed by the lower opening 1001.

The first covering layer 13 can comprise an adhering layer 13a and a protecting layer 13b. The adhering layer 13a can be made of acrylic or epoxy materials. A thickness of the adhering layer 13a can be from 10 μm to 30 μm. The first covering layer 13 can be made of insulating materials.

Referring to FIG. 2, a second covering layer 15 is provided. The second covering layer 15 has an upper opening 16. The second covering layer 15 is adhered to the first covering layer 13. An inner diameter of the upper opening 16 is less than an inner diameter of the lower opening 1001. The upper opening 16 is formed in the lower opening 1001. A portion of the circuit layer 12 is exposed by the upper opening 16. A second flexible precursor board 200 is produced.

The second covering layer 15 can comprise a covering portion 151 and an inserting portion 152. The covering portion 151 is formed on a top surface of the first covering layer 13. The inserting portion 152 is formed on an inner surface of the lower opening 1001 and defines the upper opening 16. The second covering layer 15 can be made of insulating materials.

Figure 3:
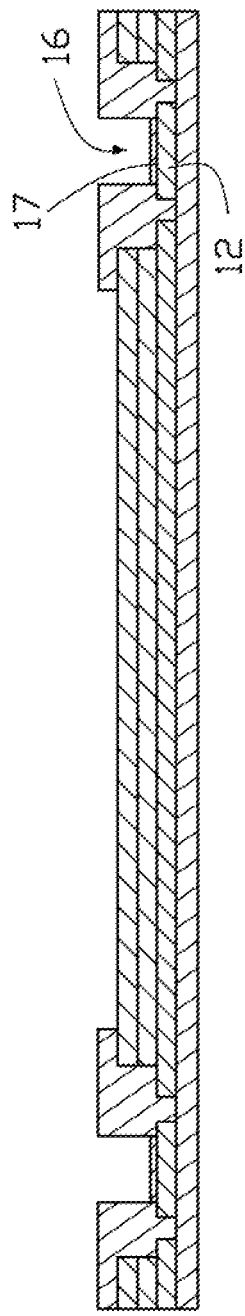

Referring to FIG. 3, a coating layer 17 is formed on the circuit layer 12 exposed from the upper opening 16. The coating layer 17 can be made of Ni/Au, Ag, Au, or Sn.

Figure 4:
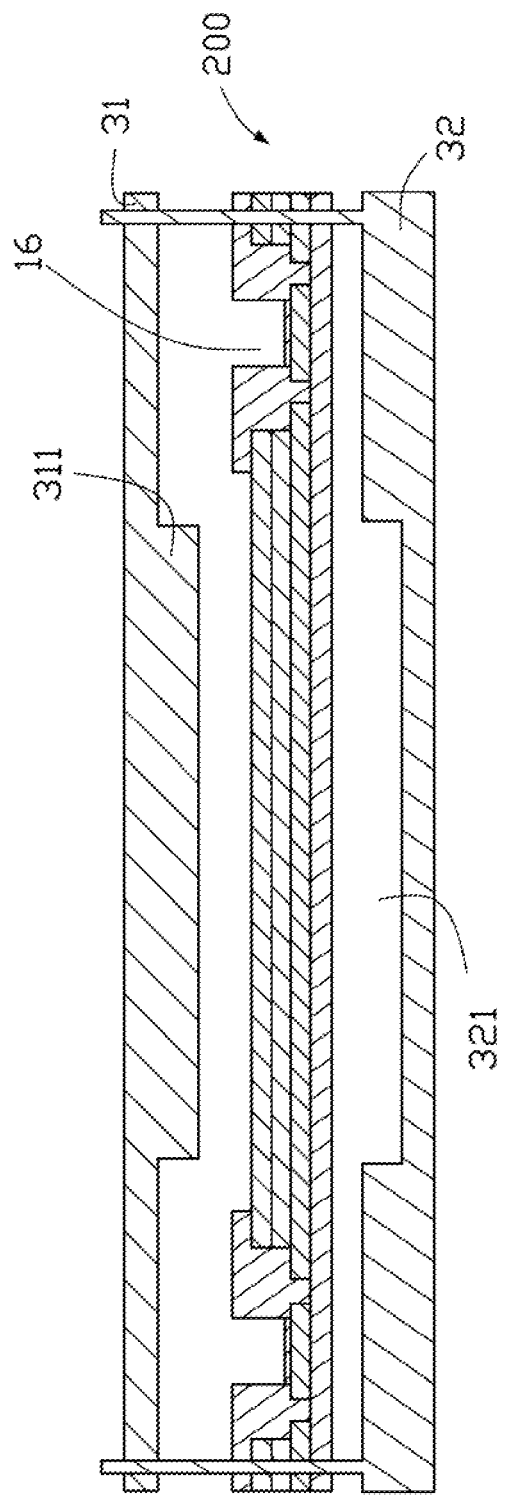

Referring to FIG. 4, an upper mould 31 and a lower mould 32 are provided. The upper mould 31 has a protruding portion 311. The lower mould 32 has a recessed portion 321. The second flexible precursor board 200 is placed between the upper mould 31 and the lower mould 32. A portion of the second flexible precursor board 200 is positioned between the protruding portion 311 and the recessed portion 321. A periphery of the second flexible precursor board 200 is positioned away from the protruding portion 311 and the recessed portion 321. The upper opening 16 is positioned away from the protruding portion 311 and the recessed portion 321. The upper mould 31 is pressed to the lower mould 32. The protruding portion 311 is pressed into the recessed portion 321.

Referring to FIG. 5, the upper mould 31 and the lower mould 32 are removed to obtain the flexible printed circuit board 10.

Figure 6:
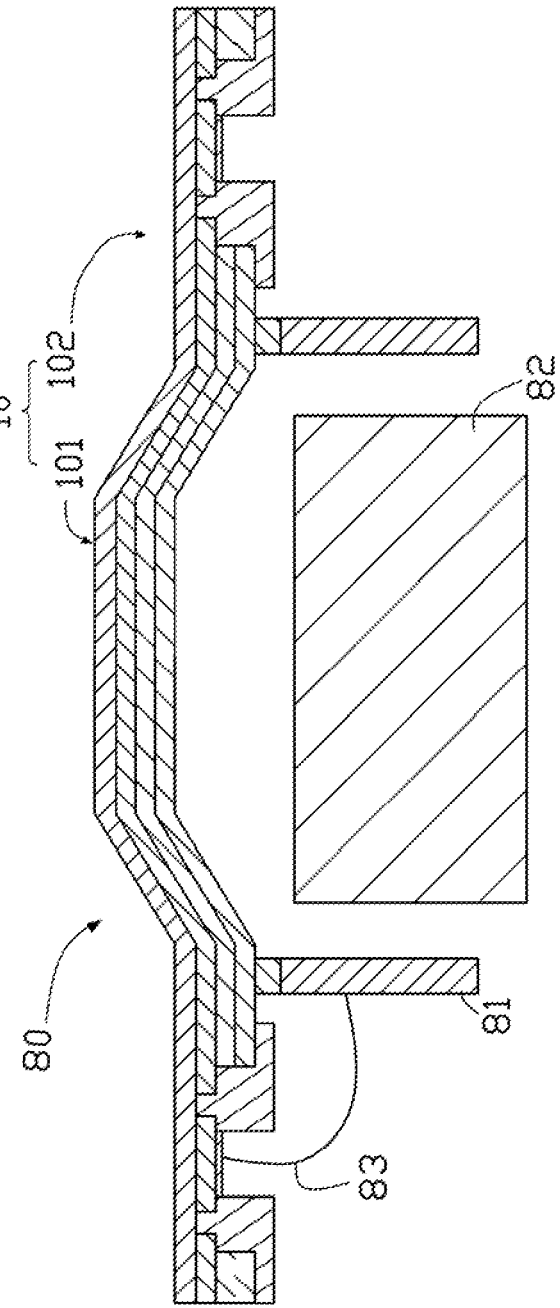
FIG. 6 is a cross section view of a loudspeaker with the flexible printed circuit board of FIG. 5 in accordance with an exemplary embodiment of the present disclosure.

Referring to FIG. 6, a loudspeaker 80 is also disclosed. The loudspeaker 80 comprises the flexible printed circuit board 10 used as a dome and a holder supporting the dome, a voice coil 81, and a magnet 82.

The voice coil 81 is adhered to the supporting portion 102 of the flexible printed circuit board 10. The voice coil 81 is away from the dome portion 101. The voice coil 81 surrounds the magnet 82. The dome portion 101 is positioned over the magnet 82. A wire 83 electrically connects the circuit layer 12 of the flexible printed circuit board 10 and the voice coil 81 through the upper opening 16.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A flexible printed circuit board used in a loudspeaker as a dome and a holder supporting the dome having a top surface and a bottom surface opposite to the top surface, the flexible printed circuit board comprising:
   a dome portion being a recess depressed from the top surface to the bottom surface;
   a supporting portion surrounding the dome portion and extending from ends of the dome portion;
   a first covering layer with a lower opening;
   a second covering layer; and
   a coating layer;
   wherein the flexible printed circuit board comprises at least one circuit layer, the flexible printed circuit board has an upper opening, and the upper opening is open at the supporting portion to expose a portion of the circuit layer, the first covering layer is formed on the circuit layer, and a portion of the circuit layer is exposed by the lower opening, the second covering layer is formed on the first covering layer, the coating layer is formed on the circuit layer exposed from the upper opening, the coating layer is made of conductive metal.

2. The flexible printed circuit board of claim 1, wherein the dome portion has a bottom wall and a side wall.

3. The flexible printed circuit board of claim 2, wherein the bottom wall is parallel to the supporting portion.

4. The flexible printed circuit board of claim 2, wherein an angle is defined between the side wall and the supporting portion, and the angle is from 90° to 180°.

5. The flexible printed circuit board of claim 2, wherein a depth is a distance defined from the top surface of the flexible printed circuit board to a top surface of the bottom wall of the dome portion, and the depth is smaller than 1000 μm.

6. The flexible printed circuit board of claim 1, wherein the second covering layer comprises a covering portion and an inserting portion, the covering portion is formed on a top surface of the first covering layer, and the inserting portion is received on an inner surface of the lower opening and defines the upper opening.

7. A loudspeaker comprises:
   a flexible printed circuit board used as a dome and a holder supporting the dome having a top surface and a bottom surface opposite to the top surface, the flexible printed circuit board comprising:
      a dome portion being a recess depresses from the top surface to the bottom surface;
      a supporting portion surrounding the dome portion and extending from ends of the dome portion;
      a first covering layer with a lower opening;
      a second covering layer; and
      a coating layer;
   a voice coil adhered to the supporting portion of the flexible printed circuit board, the voice coil being away from the dome portion; and
   a magnet, the voice coil surrounding the magnet, the dome portion being positioned over the magnet;
   wherein the flexible printed circuit board comprises at least one circuit layer, the flexible printed circuit board has an upper opening, the upper opening is open at the supporting portion to expose a portion of the circuit layer, the first covering layer is formed on the circuit layer, and a portion of the circuit layer is exposed by the lower opening, the second covering layer is formed on the first covering layer, the coating layer is formed on the circuit layer exposed from the upper opening, the coating layer is made of conductive metal.

8. The loudspeaker of claim 7, wherein the dome portion has a bottom wall and a side wall.

9. The loudspeaker of claim 8, wherein the bottom wall is parallel to the supporting portion.

10. The loudspeaker of claim 8, wherein an angle is defined between the side wall and the supporting portion, and the angle is from 90° to 180°.

11. The loudspeaker of claim 8, wherein a depth is a distance defined from the top surface of the flexible printed circuit board to a top surface of the bottom wall of the dome portion, and the depth is smaller than 1000 µm.

12. The loudspeaker of claim 7 further comprising a wire electrically connected between the circuit layer and the voice coil through the upper opening.

* * * * *